United States Patent
Cheng et al.

(10) Patent No.: US 7,638,379 B2
(45) Date of Patent: Dec. 29, 2009

(54) VERTICAL-CHANNEL JUNCTION FIELD-EFFECT TRANSISTORS HAVING BURIED GATES AND METHODS OF MAKING

(75) Inventors: Lin Cheng, Starkville, MS (US); Michael S. Mazzola, Starkville, MS (US)

(73) Assignees: SemiSouth Laboratories, Inc., Starkville, MI (US); Mississippi State University, Mississippi State, MI (US)

( * ) Notice: Subject to any disclaimer, the term of this patent is extended or adjusted under 35 U.S.C. 154(b) by 0 days.

(21) Appl. No.: 11/935,442

(22) Filed: Nov. 6, 2007

(65) Prior Publication Data
US 2008/0124853 A1 May 29, 2008

Related U.S. Application Data (62) Division of application No. 11/198,298, filed on Aug. 8, 2005.

(51) Int. Cl.
*H01L 21/337* (2006.01)
(52) U.S. Cl. ............... 438/193; 438/195; 257/E21.421
(58) Field of Classification Search ................ 438/142, 438/192, 193, 268, 137–138, 173, 206, 209, 438/212; 257/170, 409, E21.421
See application file for complete search history.

(56) References Cited

U.S. PATENT DOCUMENTS

| | | | |
|---|---|---|---|
| 4,587,712 A | | 5/1986 | Baliga |
| 5,264,713 A | | 11/1993 | Palmour |
| 5,391,895 A | | 2/1995 | Dreifus |
| 5,468,661 A | * | 11/1995 | Yuan et al. ............... 438/193 |
| 5,747,842 A | | 5/1998 | Plumton |
| 5,909,110 A | * | 6/1999 | Yuan et al. ............... 323/282 |

(Continued)

FOREIGN PATENT DOCUMENTS

WO 00/38246 A1 6/2000

OTHER PUBLICATIONS

"Top Performance of SiC Power Transistor Designed for Inverters," Translation of AIST press released on Mar. 28, 2005.

(Continued)

*Primary Examiner*—Savitri Mulpuri
*Assistant Examiner*—Calvin Choi
(74) *Attorney, Agent, or Firm*—Morris, Manning & Martin, LLP; Christopher W. Raimund (57) ABSTRACT

Semiconductor devices and methods of making the devices are described. The devices can be implemented in SiC and can include epitaxially grown n-type drift and p-type trenched gate regions, and an n-type epitaxially regrown channel region on top of the trenched p-gate regions. A source region can be epitaxially regrown on top of the channel region or selectively implanted into the channel region. Ohmic contacts to the source, gate and drain regions can then be formed. The devices can include edge termination structures such as guard rings, junction termination extensions (JTE), or other suitable p-n blocking structures. The devices can be fabricated with different threshold voltages, and can be implemented for both depletion and enhanced modes of operation for the same channel doping. The devices can be used as discrete power transistors and in digital, analog, and monolithic microwave integrated circuits.

14 Claims, 12 Drawing Sheets

U.S. PATENT DOCUMENTS

| | | | |
|---|---|---|---|
| 5,910,665 | A | 6/1999 | Plumton et al. |
| 6,097,046 | A * | 8/2000 | Plumton ............... 257/266 |
| 6,344,663 | B1 | 2/2002 | Slater, Jr. et al. |
| 6,503,782 | B2 | 1/2003 | Casady et al. |
| 6,767,783 | B2 | 7/2004 | Casady et al. |
| 7,105,875 | B2 | 9/2006 | Singh |
| 7,119,380 | B2 | 10/2006 | Sankin et al. |
| 2003/0042538 | A1* | 3/2003 | Kumar et al. ............... 257/328 |
| 2005/0067630 | A1 | 3/2005 | Zhao |

OTHER PUBLICATIONS

J. W. Palmour, et al., "Low-frequency noise in 4H—silicon carbide junction field effect transistors," Appl. Phys. Lett. vol. 68, No. 19, May 6, 1996.

P.G. Neudeck, et al., "600° C. Logic Gates Using Silicon Carbide JFET's," NASA/TM-2000-209928, National Aeronautics and space Administration, Glenn Research Center, pp. 1-4.

J. N. Merrett, et al., "Gamma and Proton Irradiation Effects on 4H-SiC Depletion-Mode Trench JFETs," Materials Science Form, vols. 483-485, pp. 885-888, 2005.

L. Cheng, et al., "Cryogenic and High Temperature Performance of 4H-SiC Vertical Junction Field Effect Transistors (VJFETs) for Space Applications," Proceedings of The 17th International Symposium on Power Semiconductor Devices and ICs (ISPSD '05), May 22-26, 2005, Santa Barbara, CA.

J.N. Merrett, et al., "Silicon Carbide Vertical Junction Field Effect Transistors Operated at Junction Temperatures Exceeding 300° C.," Proceedings of IMAPS International Conference and Exhibition on High Temperature Electronics (HiTECH 2004), May 17-20, 2004, Santa Fe, NM.

S. Onda, et al., "SiC Integrated MOSFETs," Phys. Stat. Sol. (a), vol. 162, p. 369-388, 1997.

N. Nordell, et al., "Homoepitaxy of 6H and 4H SiC on nonplanar substrates," Appl. Phys. Lett., vol. 72, No. 2, pp. 197-199, Jan. 12, 1998.

Y. Chen, et al., "Homoepitaxial Growth of 4H-SiC on Trenched Substrates by Chemical Vapor Deposition," Mater. Sci. Forum, vol. 457-460, pp. 189-192, 2004.

K. Shenai, et al., "Optimum Semiconductors for High Power Electronics", IEEE Transactions on Electron Devices, vol. 36, No. 9, pp. 1811-1823, 1989.

Chen, Yi, "Homoepitaxial Growth of 4H-SiC on Trenched Substrates by Chemical Vapor Deposition," Materials Science Forum, vols. 457-460 (2004), pp. 189-192.

Cheng, L., "Cryogenic and High Temperature Performance of 4H-SiC Vertical Junction Field Effect Transistors (VJFETs) for Space Applications," Proceedings of the 17$^{th}$ International Symposium on Power Semiconductor Devices & IC's, May 23-26, 2005.

Merrett, J.N., "Silicon Carbide Vertical Junction Field Effect Transistors Operated at Junction Temperatures Exceeding 300° C.,"Dept. of Electrical and Computer Engineering, Mississippi State University.

Merrett, J.N., "Gamma and Proton Irradiation Effects on 4H-SIC Depletion-Mode Trench JFETs," Materials Science Form, vols. 483-485 (2005), pp. 885-888.

Neudeck, Philip G. et al., "600° C. Logic Gates Using Silicon Carbide JFET's," NASA/TM-2000-209928, National Aeronautics and Space Administration, Glenn Research Center., pp. 1-4.

Nordell, N. et al., "Homoepitaxy of 6H and 4H SiC on nonplanar substrates," Appl. Phys. Lett. 72 (2), Jan. 12, 1998.

Onda, S. et al., "SiC Integrated MOSFETs," Phys. Stat. Sol. (a), 162, (1997), pp. 369-388.

Palmour, J.W., "Low-frequency noise in 4H-silicon carbide junction field effect transistors," Appl. Phys. Lett. 68 (19), May 6, 1996.

"Top Performance of SiC Power Transistor Designed for Inverters," Translation of AIST press released on Mar. 28, 2005.

Mihalla, et al., "Buried field rings - a novel edge termination method for 4H-SiC high voltage devices," Semiconductor Conference, vol. 2, pp. 245-248 (2002).

* cited by examiner

VERTICAL-CHANNEL JUNCTION FIELD-EFFECT TRANSISTORS HAVING BURIED GATES AND METHODS OF MAKING

CROSS REFERENCE TO RELATED CASES

This application is a divisional of U.S. patent application Ser. No. 11/198,298, filed on Aug. 8, 2005, which is incorporated by reference herein in its entirety.

STATEMENT REGARDING FEDERALLY SPONSORED RESEARCH OR DEVELOPMENT

This invention was made with U.S. Government support under F33615-01-D-2103, awarded by the U.S. Air Force Research Laboratory. The U.S. Government may have certain rights in the invention.

BACKGROUND

1. Technical Field

The present application relates, in general, to semiconductor devices and, more particularly, to vertical-channel junction field effect transistors (VJFETs) having buried gates and to methods of making these devices.

2. Background of the Technology

Silicon Carbide (SiC), a wide band-gap semiconductor material, is very attractive for use in high-power, high-temperature, and/or radiation resistant electronics. SiC power switches are logical candidates for these applications due to their excellent material physical properties such as wide energy band-gap, high breakdown field strength, highly saturated electron drift velocity and high thermal conductivity compared to the conventional silicon counter part. In addition to the above advantages, SiC power devices can operate with lower specific on-resistance than conventional silicon power devices [1].

JFETs in SiC are especially attractive for high power applications thanks to the inherent stability of their p-n junction gate, which is free from gate oxidation problems concerning channel mobility in MOS structure and high-temperature reliability issues in MESFETs having metal-semiconductor Schottky barrier.

Because of the fundamental differences in material properties and processing technologies, traditional Si or GaAs microelectronics technologies in JFETs can not be easily transferred to SiC. A number of reports of SiC JFETs have appeared in the last decade (e.g., [2-4]). An example of a vertical channel JFET employing a recessed gate structure can be found in U.S. Pat. No. 4,587,712 [5]. An example of a lateral JFET formed in SiC can be found in U.S. Pat. No. 5,264,713 [2]. Enhanced-mode JFET for digital ICs with resistive load has been reported in 2000 [6]. JFET-based ICs can also be implemented in either complementary n-type and p-type channels as disclosed in U.S. Pat. No. 6,503,782 [7] or enhanced-depletion (n-type channels) forms. SiC JFETs have proven to be radiation tolerant while demonstrating minimal threshold voltage shift over a wide temperature range [8, 9].

Most of the obstacles to low-cost volume manufacturing can be traced back to the gate-level process steps. In addition, the p-type gate contact can be difficult to fabricate in SiC because of the large band-gap of SiC. In fact, low resistivity contacts to p-type SiC have only been formed on heavily doped p-type SiC.

The VJFET (i.e., a JFET with a vertical channel structure) can be fabricated smaller than a JFET with a lateral channel structure, which leads to lower cost in volume manufacturing of discrete transistors, and can also increase the packing density in large scale integrated circuits. To obtain a vertical channel in SiC VJFETs, ion implantation is often used to form the $P^+$ gate region [8-10]. It can be difficult, however, to precisely control the channel length by ion implantation because of a combination of uncertainties on actual depth profile of implantation tail, defect density, redistribution of implanted ions after thermal annealing, and ionization percentage of dopant atoms and point defects under different bias and/or temperature stress.

Alternative methods to form a vertical channel have also been employed. One method is to selectively grow $P^+$ gate regions epitaxially as taught in U.S. Pat. No. 6,767,783 [11].

There still exists a need, however, for improved high volume, low cost manufacturing methods for VJFETs that allow for the precise control of channel length during manufacture.

SUMMARY

According to a first embodiment, a semiconductor device is provided which comprises:

a substrate layer comprising a semiconductor material of a first conductivity type;

a drift layer on the substrate layer, the drift layer comprising a semiconductor material of the first conductivity type;

a gate region on the drift layer, wherein the gate region comprises a semiconductor material of a second conductivity type different than the first conductivity type;

a channel layer of the first conductivity type on the drift layer and covering a first portion of the gate region; and a source layer of the first conductivity type on the channel layer.

The drift layer of the device can be on a buffer layer comprising a semiconductor material of the first conductivity type wherein the buffer layer is on the semiconductor substrate. The semiconductor material of the substrate layer, the drift layer, the gate regions and the channel layer can be silicon carbide. The semiconductor material of the first conductivity type can be an n-type semiconductor material and the semiconductor material of the second conductivity type can be a p-type semiconductor material.

According to a second embodiment, a method of making a semiconductor device is provided which comprises:

selectively etching through a gate layer of semiconductor material of a second conductivity type on a drift layer of semiconductor material of a first conductivity type different than the second conductivity type to expose material of the drift layer, wherein the drift layer is on a semiconductor substrate;

depositing a channel layer of semiconductor material of the first conductivity type on exposed portions of the gate and drift layers to cover the gate layer;

depositing a source layer of semiconductor material of the first conductivity type on the channel layer or, alternatively, implanting a source layer of semiconductor material of the first conductivity type in the channel layer;

selectively etching through the channel layer in a peripheral region of the device to expose a portion of the underlying gate layer, wherein an unexposed portion of the gate layer of the device remains covered by the channel and source layers;

depositing a layer of a dielectric material on exposed surfaces of the source layer, the channel layer and the gate layer;

selectively etching through the dielectric layer over the portion of the gate layer exposed during etching of the channel layer to expose underlying gate layer; and selectively etching through the dielectric layer over the source layer on the unexposed portion of the gate layer to expose underlying source layer.

The channel layer can be deposited by epitaxial growth on exposed portions of the gate and drift layers. The source layer can be deposited by epitaxial growth on the channel layer or implanted in the channel layer.

REFERENCE NUMERALS

1. Substrate
2. $N^+$ buffer layer
3. N-type drift region
4. P-type buried gate fingers
5. P-type gate pads for metal contacts
6(a). P-type passivated guard rings
6(b). P-type buried guard rings
7. N-type planarized channel region
8. N-type trench-fill in guard ring regions
9(a). Homoepitaxially regrown N-type source region
9(b). Selectively implanted N-type source region
10. Isolation dielectric
11. Passivation dielectric
12. Drain metal contact
13. Gate metal contacts
14. Source metal contact

DETAILED DESCRIPTION

An object of the present invention is to provide a vertical-channel Junction Field-Effect Transistor (JFET) with all epitaxially grown drift, buried gate, passivated or buried guard rings, planarized channel with either epitaxially grown or implanted source regions in SiC, that can be made electrically isolated from the other devices fabricated on the same die, and that can be implemented in such a way that the devices fabricated on the same die may have different threshold voltages.

A further object of the invention is to provide the concept and an example of planarization of trenched p-gate by homoepitaxial over-growth of channel and source regions on a silicon carbide patterned substrate.

A further object of the invention is to provide the concept and an example of planarization of trenched p-gate by homoepitaxial over-growth of only the channel region with the source region formed by implantation on a silicon carbide patterned substrate.

A further object of the invention is to provide a method of the fabrication of the above devices.

The present application relates generally to a Junction Field-Effect Transistor (JFET) with vertical channel. In particular, the present application relates to such transistors formed in silicon carbide (SiC).

The present device is built on a silicon carbide substrate, which can be electrically either p-type or n-type with same type buffer layer. For using the n-type substrate, the device comprises epitaxially grown n-type drift and p-type trenched gate regions, and epitaxially regrown n-type planarized channel and source layers either epitaxially regrown or implanted. The device structure is defined using conventional photolithography and plasma dry-etch. The Ohmic contacts to the source and gate regions are formed on top of the wafer while the Ohmic contact to the drain region is formed on the backside of the wafer. Depending on the vertical channel width, the proposed JFET may have different threshold voltages, and can be implemented for both depletion and enhanced modes of operation for the same channel doping. Fabricated on the same wafer or die, the proposed devices with different threshold voltages can be used for both digital and analog integrated circuits. In addition, the devices described above, can be used in monolithic microwave integrated circuits (MMICs). Moreover, the devices described above can be fabricated monolithically with power rectifiers on the same wafer or die for use in power switching circuits.

As described in more detail below, a $P^+$ layer can be epitaxially grown on top of an n-type drift region, followed by etching down to the drift region to form a patterned $P^+$ layer. In this manner, $P^+$ gate fingers, gate pads for external contacts, and $P^+$ guard rings for edge termination can be formed. The n-type channel and $n^+$ source regions can then be over-grown on the structured $P^+$ gate and guard ring regions. Alternatively, only an n-type channel may be grown followed by selective implantation of impurity atoms that produce n-type doping to form the source region.

Devices having an epitaxially grown p-type gate VJFET as described above have certain advantages over VJFET devices having an implanted gate. These advantages include the following:

Vertical channel dimension can be precisely and readily controlled;

Heavily doped p-type gate regions can be achieved without high-temperature post anneal, leading to a low gate contact resistivity and an enhanced gate modulation sensitivity;

Channel and gate regions are free of implantation damage, resulting in a reduction in gate resistance, problem of interface charges, and variation of channel configuration;

More robust/reliable p-gate, less leakage current, and less threshold voltage shift with temperature due to ionization of P-type dopant and defects;

Simplify fabrication with 30-50% less process steps resulting in higher yield and a significantly reduced manufacturing cost.

Once the buried epitaxial gate is formed, the channel and source regions can be over-grown on the trenched gate and guard ring regions. The gate trenches can be filled with lightly doped n-type SiC serving as the channel. To obtain the design channel length and the corresponding threshold voltage and blocking capability, the source-channel interface can be separated from the top of the gate fingers. Also the thickness of the source region should be larger than the penetration depth of metal-silicide into the source region during metal ohmic-contact formation.

Considering the effect of surface topology on the photolithography and metal contact steps remaining after over-growth of channel and source regions, it is preferable to have reasonably planarized channel and source layers on top of the p-gate trench regions. However, the alternating trenches and p-gate fingers normally work against the planar growth of a regrown channel epitaxial layer. A substantially planar channel layer can be formed by employing the proper combination of factors. These factors include the crystallographic orientations of the trench sidewall, bottom, and top and the C/Si ratio on the epitaxy growth rates on the trench sidewall. An MOS transistor designated an epi-channel (EC)-FET with a thin n-type epilayer over-grown on the p-body trench sidewall has been disclosed [12]. In addition, homoepitaxial growth of 6H- and 4H-SiC using low-pressure chemical vapor deposition (CVD) on substrates patterned with stripe mesas and trenches and the growth behavior near stripe mesas and in trenches at different C/Si ratios has been investigated [13]. In addition, the homoepitaxial growth of 4H-SiC on trenched substrates by chemical vapor deposition has also been investigated [14]. It has been found that high super-saturation at the large C/Si ratio enhances the formation of facets and overhangs, due to short diffusion lengths of atoms and the difference in growth kinetics between lattice planes [13].

The present inventors have discovered that by optimizing trench orientation, planarized n-type channel and source regions can be homoepitaxially over-grown on trenched SiC substrates free of key-holes (i.e., free of voids or inclusions in the single-crystal epitaxial material).

Subsequent to the development of the technology described herein, a SiC power transistor having a buried p+ gate was disclosed (English Translation of Press Release dated Mar. 28, 2005 entitled "Top Performance of SiC Power Transistor Designed for Inverters", National Institute of Advanced Industrial Science and Technology). The device described in this publication, however, includes a source region formed by ion implantation and a heat treatment (i.e., annealing) at 1600° C. These additional process steps increase both the cost of manufacturing the device and the time required to manufacture the device. Furthermore, damage induced during ion implantation and post implantation anneal at very high temperatures ($\geq 1500°$ C.) can cause the contact resistance and gate-to-source leakage current to increase, which can greatly degrade device performance including forward conduction and blocking capability. Therefore, the device described herein having epitaxially grown source, channel, gate and drift layers can be made at a lower cost and can exhibit improved device performance.

The devices described herein can be implemented in silicon carbide (SiC). Silicon carbide crystallizes in more than 200 different poly-types. The most important are: 3C-SiC (cubic unit cell, zincblende); 2H-SiC; 4H-SiC; 6H-SiC (hexagonal unit cell, wurtzile); 15R-SiC (rhombohedral unit cell). However, the 4H-poly-type is more attractive for power devices thanks to its higher electron mobility. Although the 4H-SiC is preferred, the devices and integrated circuits described herein can be made of other poly-types of silicon carbide.

Figure 1A:
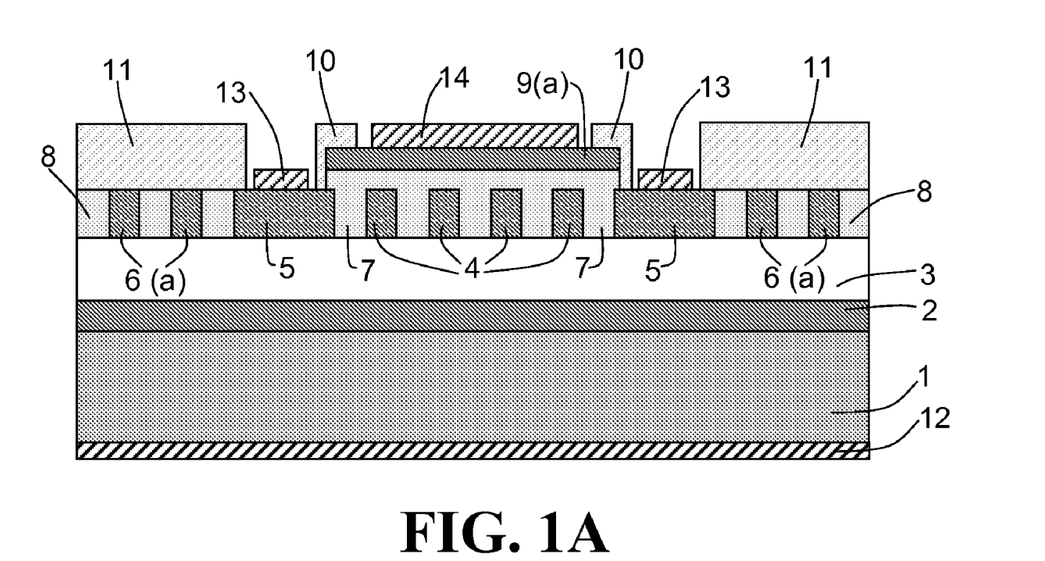
FIG. 1A is a schematic 2-dimensional illustration of a multi-finger vertical trench JFET with an epitaxially regrown or selectively implanted source region and passivated guard rings.
Figure 1B:
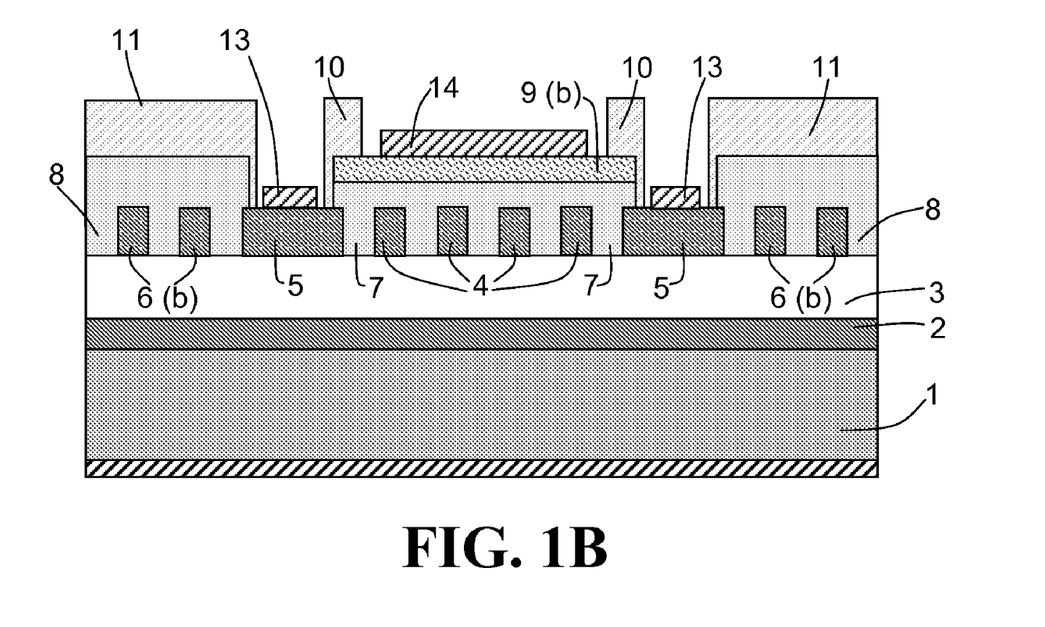
FIG. 1B is a schematic 2-dimensional illustration of a multi-finger vertical trench JFET with epitaxially regrown or selectively implanted source region and buried guard rings.

An example schematic 2-dimensional view is shown of a semiconductor device referred to as Vertical-Channel Junction Field-Effect Transistor (VJFET) is shown in FIGS. 1A and 1B. The device shown in FIGS. 1A and 1B is built on a silicon carbide substrate, which can be either p-type or n-type with a buffer layer of the same type. The device shown in FIGS. 1A and 1B comprises epitaxially grown n-type drift and p-type trenched gate regions, and epitaxially regrown n-type channel layers with epitaxially regrown or selectively implanted source region on top of the trenched p-gate. The device structure can be defined using conventional photolithography and plasma dry-etch. The ohmic contacts to the source and gate regions are formed on top of the wafer while the ohmic contact to the drain region is formed on backside of the wafer. The guard ring region can be either exposed to the passivation dielectric layer as shown in FIG. 1A or buried into lightly doped N-type channel layer as shown in FIG. 1B.

Figure 2:
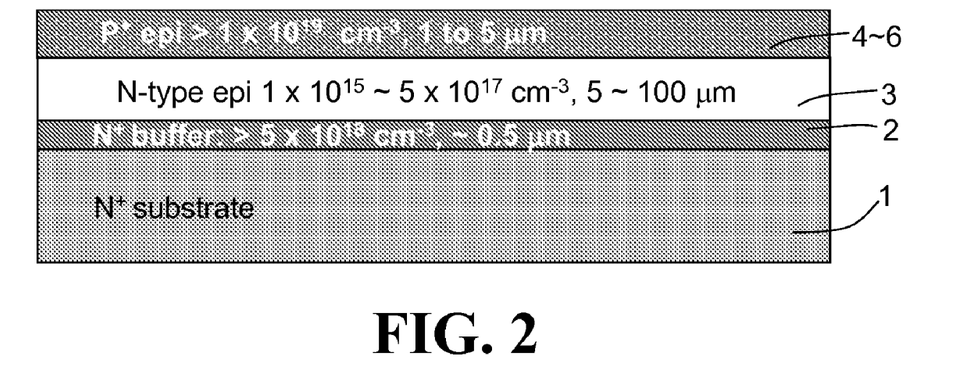
FIG. 2 is a schematic diagram of a substrate with epitaxially grown $N^+$ buffer, N-type drift, and $P^+$ gate layers that can be used in the manufacture of a vertical trench JFET.

A schematic diagram shows a starting $N^+$ substrate having an epitaxially grown N+buffer layer, an N-type drift layer, and a $P^+$ layer is shown in FIG. 2. A high-quality, heavily doped, thin $N^+$ buffer layer with minimum defect density serves as a good stop of electrical field at the interface of the N-type drift layer and the $N^+$ buffer layer. The lightly doped N-type drift region provides the blocking capability, while the heavily doped $P^+$ epi-layer can be used to form p-type gate and guard ring regions.

Figure 3:
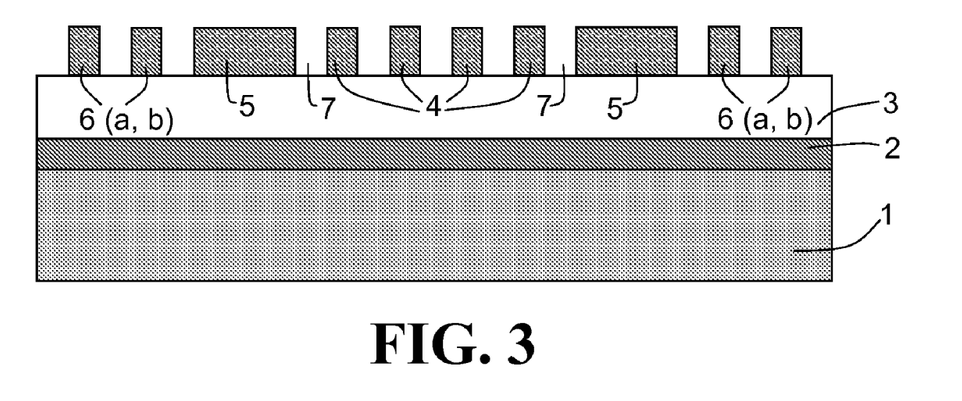
FIG. 3 is a schematic diagram of trenched $P^+$ gate and guard ring regions formed on top of an N-type drift layer.

The $P^+$ epi-layer of the structure shown in FIG. 2 can be patterned as illustrated in FIG. 3. Patterning can be performed using a mask (e.g., photo-resist, lifted-off metal, oxides, or any other known masking material) then etched down to the n-type drift regions to simultaneously form $P^+$ gate fingers and trenches for channel modulation, $P^+$ gate pads for metal contact, and $P^+$ guard rings for edge termination of electrical field.

Therefore, as shown in FIG. 3, selectively etching through the gate layer can form a plurality of elongate regions oriented parallel and in spaced relation to one another on the drift layer in the central region of the device.

Figure 4:
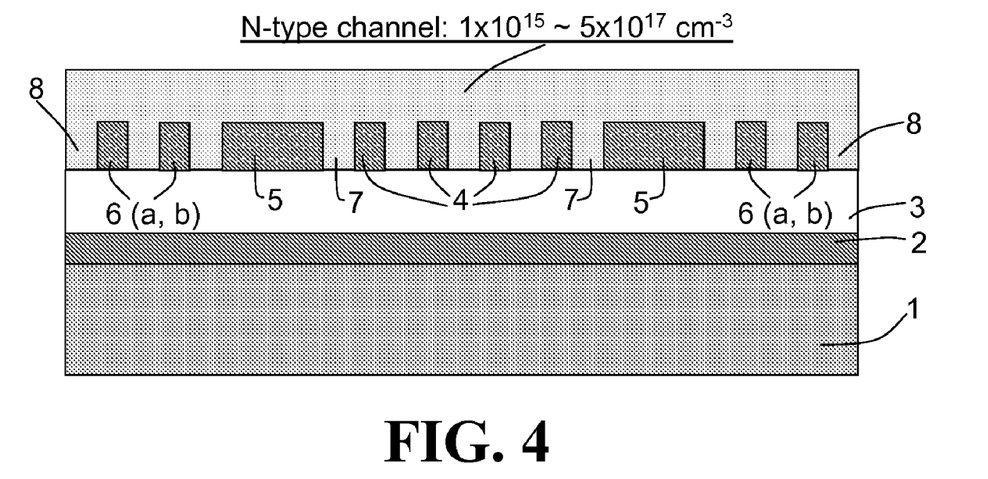
FIG. 4 is a schematic diagram of the $P^+$ gate and guard ring regions of the structure shown in FIG. 3 trench-filled and planarized with N-type channel layer.

The trenched $P^+$ epi-layer of the structure shown in FIG. 3 can then be filled and planarized with homoepitaxial N-type channel layer, followed by a formation of $N^+$ source layer either homoepitaxially regrown or implanted as shown in FIG. 4. Self-planarizing regrowth can be conducted using optimal crystallographic and trench orientations with respect to the direction of the off-cut from the crystallographic basal plane (for example, [0001]) and the major flat of the substrate. The same is true for 4H-SiC cut 8° or 4° off of [0001] towards the <112-0> direction and 6H-SiC cut 3.50 off of [0001] towards the <112-0> direction. The orthogonal orientation of the off-cut with respect to the major flat works equally well.

In the method depicted in FIGS. 2-4, the SiC layers can be formed by doping the layers with donor or acceptor materials using known techniques. Exemplary donor materials include nitrogen and phosphorus. Nitrogen is a preferred donor material. Exemplary acceptor materials for doping SiC include boron and aluminum. Aluminum is a preferred acceptor material. The above materials are merely exemplary, however, and any acceptor and donor materials which can be doped into silicon carbide can be used. The doping levels and thicknesses of the various layers of the Vertical-Channel JFET described herein can be varied to produce a device having desired characteristics for a particular application. Similarly, the dimensions of the various features of the device can also be varied to produce a device having desired characteristics for a particular application.

Figure 5A:
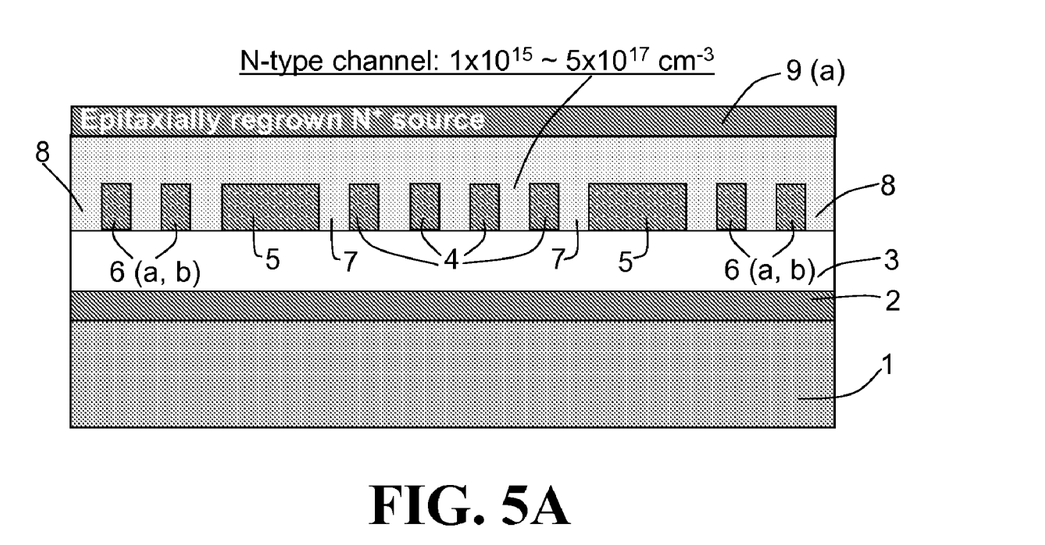
FIG. 5A is a schematic diagram of the $N^+$ source region homoepitaxially regrown on top of the N-type channel layer of the structure shown in FIG. 4.
Figure 5B:
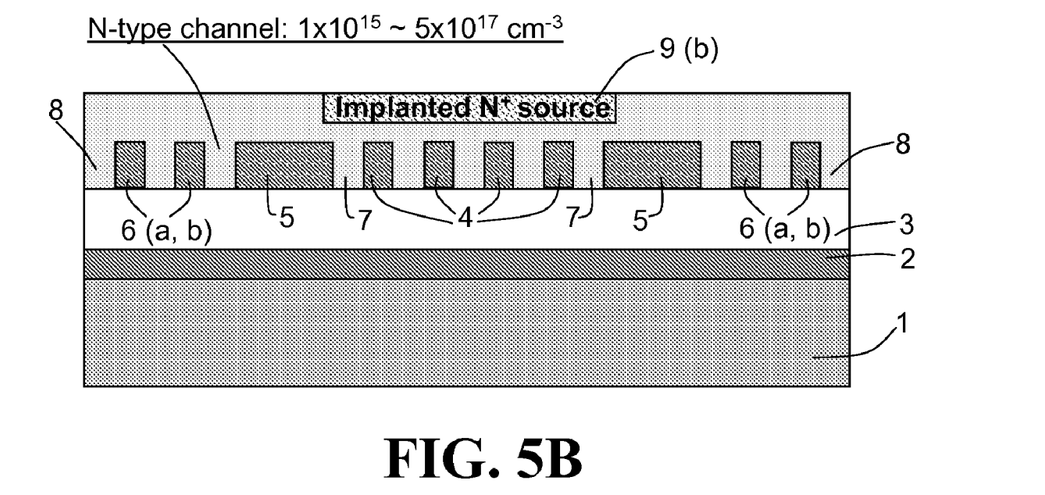
FIG. 5B is a schematic diagram of the $N^+$ source region selectively implanted in the N-type channel layer of the structure shown in FIG. 4.

The $N^+$ source region of the structure shown in FIG. 4 can be homoepitaxially regrown on top of the N-type channel layer as shown in FIG. 5A. The $N^+$ source region of the structure shown in FIG. 4 can also be selectively implanted in the N-type channel layer as shown in FIG. 5B.

Figure 6A:
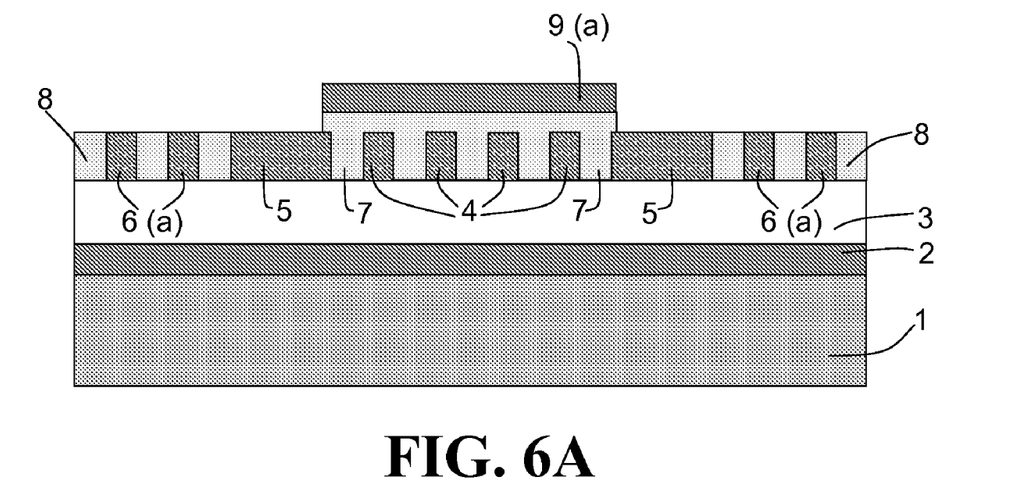
FIG. 6A is a schematic diagram of the N-type channel and source regions being patterned and etched back to expose the $P^+$ gate pads and guard ring with epitaxially regrown N-type source regions.

In order to expose the $P^+$ gate pad region for metal contacts, the N-type channel having the epitaxially regrown $N^+$ source region can be patterned and etched down to both $P^+$ gate and guard ring regions as shown in FIG. 6A. Alternatively, the N-type channel having the epitaxially regrown $N^+$ source region can be patterned and etched down to only to $P^+$ gate pad regions as shown in FIG. 6C. The $P^+$ gate trenches and fingers as shown in FIG. 6A or the $P^+$ gate trenches, fingers and guard rings as shown in FIG. 6C can be buried into the N-type channel region under the $N^+$ source region. If N-type channel layer remains on top of the $P^+$ guard rings, the epitaxially regrown $N^+$ source region needs to be completely removed from the top of the $P^+$ guard ring region by plasma dry-etch or other suitable methods.

Figure 6B:
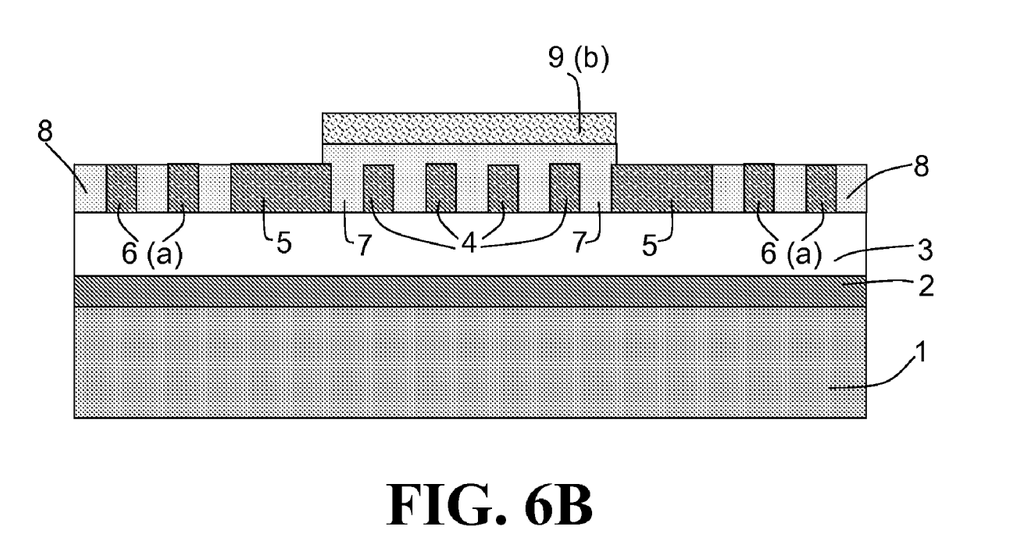
FIG. 6B a schematic diagram of the N-type channel and source regions being patterned and etched back to expose the $P^+$ gate pads and guard ring with selectively implanted N-type source regions.
Figure 6C:
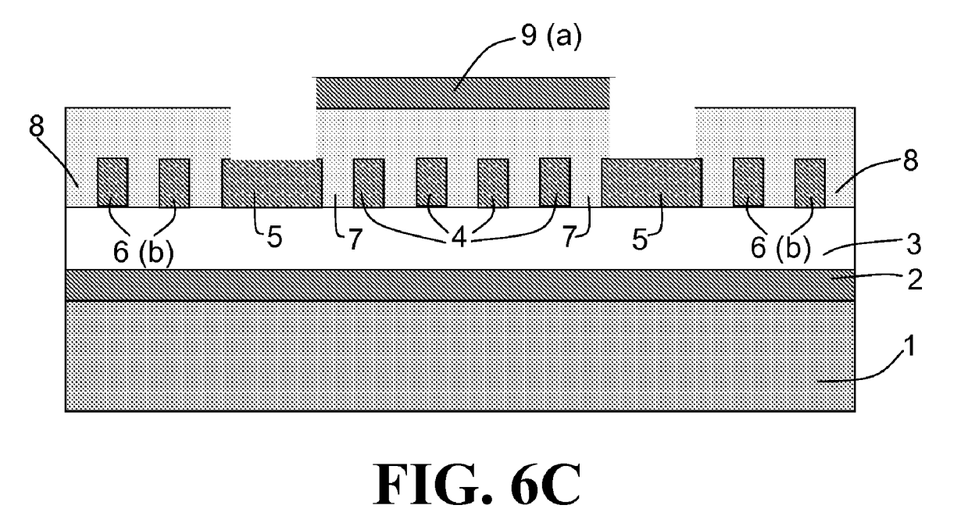
FIG. 6C is a schematic diagram of the N-type channel and source regions being patterned and etched back to expose $P^+$ gate pads with buried guard ring and epitaxially regrown N-type source regions.
Figure 6D:
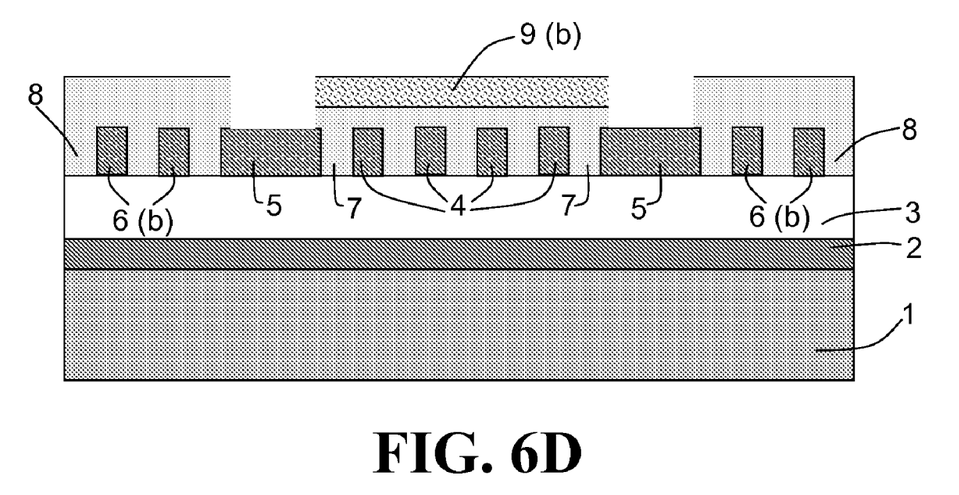
FIG. 6D is a schematic diagram of the N-type channel and source regions being patterned and etched back to expose $P^+$ gate pads with buried guard ring and selectively implanted N-type source regions.

In order to expose the $P^+$ gate pad region for metal contacts, the N-type channel with the selectively implanted $N^+$ source region is patterned and etched down to both $P^+$ gate and guard ring regions as shown in FIG. 6B or only to $P^+$ gate pad regions as shown in FIG. 6D. The $P^+$ gate trenches and fingers as shown in FIG. 6B or the $P^+$ gate trenches, fingers and guard rings as shown in FIG. 6D can be buried into the N-type channel region under the $N^+$ source region.

Figure 7A:
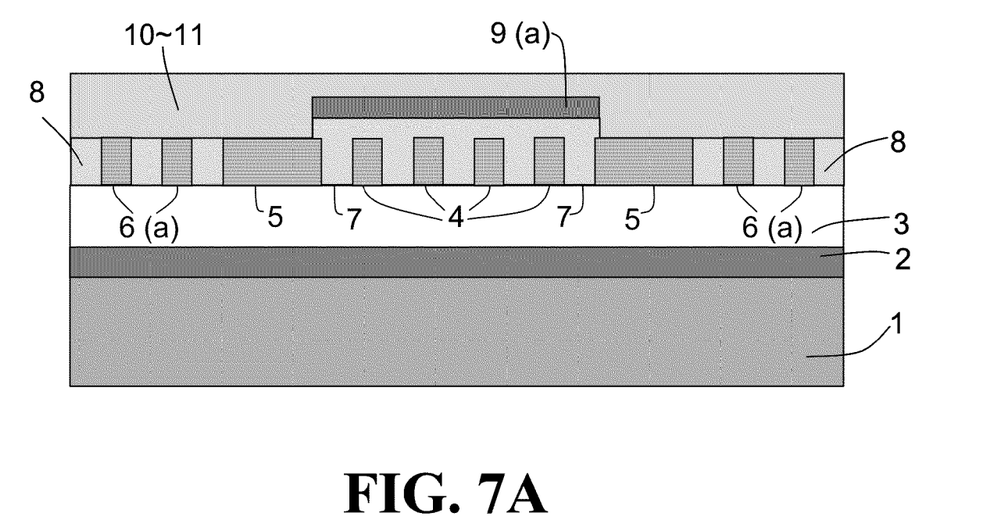
FIG. 7A is a schematic diagram of the dielectric layer(s) being blanket deposited everywhere for both electrical isolation and passivation on top of the epitaxially regrown source and the exposed $P^+$ gate pads and guard ring regions
Figure 7B:
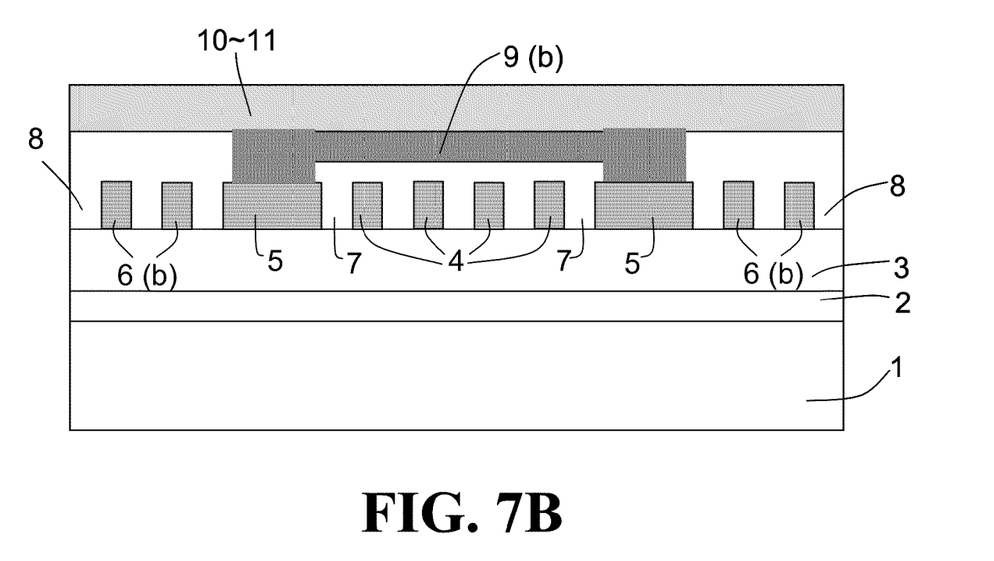
FIG. 7B is a schematic diagram of the dielectric layer(s) being blanket deposited everywhere for both electrical isolation and passivation on top of the selectively implanted source and the buried guard ring regions.

A dielectric layer or stack for electrical isolation between source and gate metal contacts and electrical field passivation outside the source and gate metal contact and top of the guard ring or the buried guard ring regions can then be grown and/or deposited anywhere on the wafer as shown in FIGS. 7A and 7B. The source region can be either epitaxially regrown on top of the N-type channel region as shown in FIG. 7A or selectively implanted into the N-type channel region as shown in FIG. 7B. The $P^+$ guard ring region can be either exposed to the dielectric layer or stack as shown in FIG. 7A or buried into the N-type channel region as shown in FIG. 7B. To obtain a maximum off-state drain-to-source blocking capability, the interface properties between n-type and p-type SiC and the dielectric layer/stack needs to be considered for minimum number of interface charges.

Figure 8A:
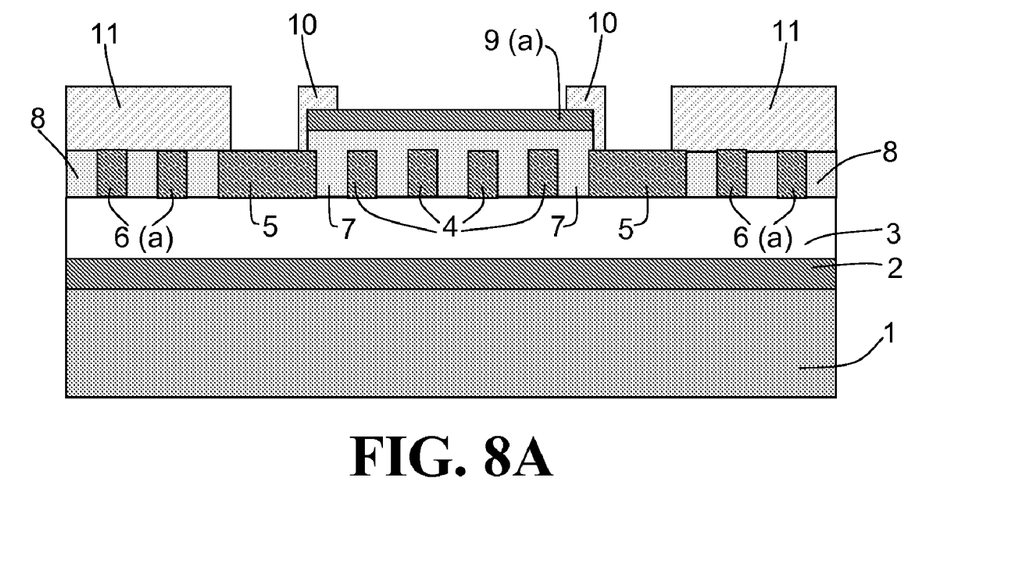
FIG. 8A is a schematic diagram of the dielectric layer(s) being patterned and etched back to open the metal contact windows on top of the gate and epitaxially regrown source regions.
Figure 8B:
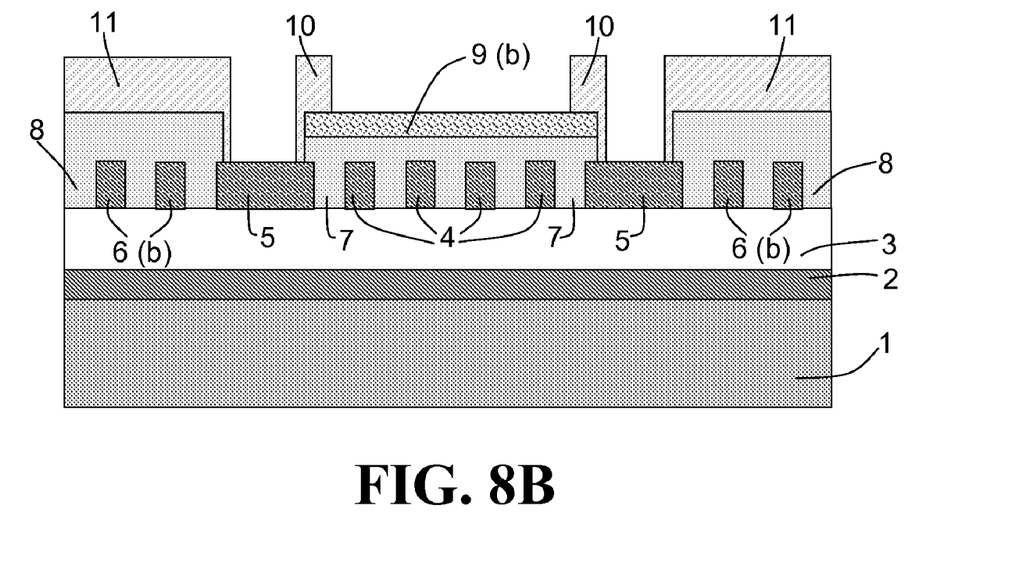
FIG. 8B is a schematic diagram of the dielectric layer(s) being patterned and etched back to open the metal contact windows on top of the gate and selectively implanted source regions.

The dielectric layer or stack can then be patterned and etched down to $P^+$ gate pad and $N^+$ source regions to open the ohmic contact windows as shown in FIGS. 8A and 8B. This can be accomplished using a self-aligned process for ohmic contact formation. To do so, the dielectric layer or stack needs to be un-reactive to the metal(s) for electrical Ohmic contacts. The thin dielectric layer or stack may not be necessary to leave on the sidewall when a lift-off process is used to pattern the source and gate contact metal(s). The source region can be either epitaxially regrown on top of the N-type channel region as shown in FIG. 8A or selectively implanted into the N-type channel region as shown in FIG. 8B. The $P^+$ guard ring region can be either exposed to the dielectric layer or stack as shown in FIG. 8A or buried into the N-type channel region as shown in FIG. 8B.

Figure 9A:
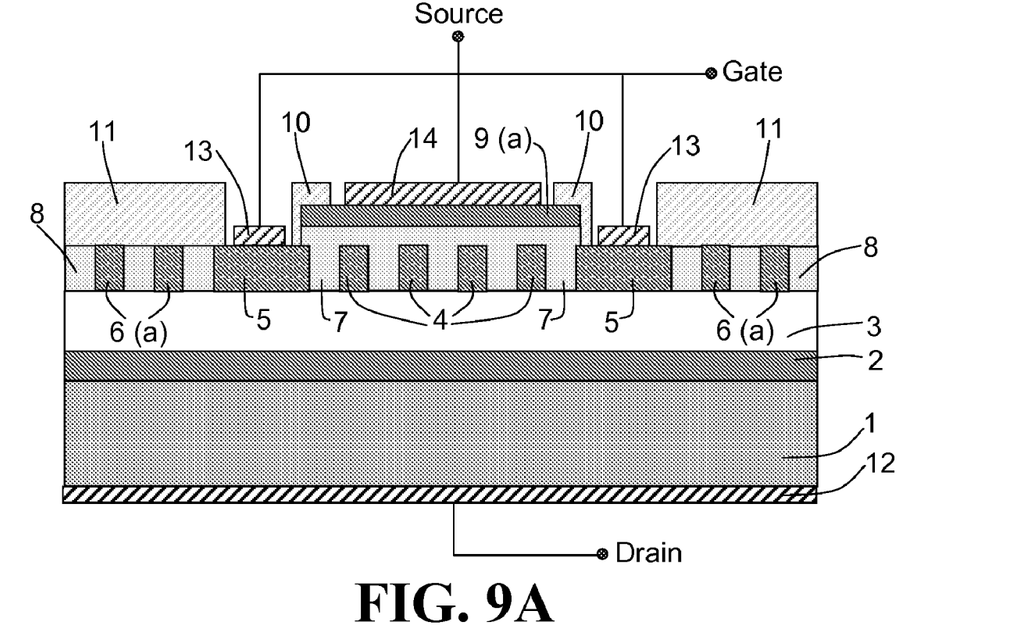
FIG. 9A is a schematic diagram of the metals being deposited to form electrically conducting contacts to gate, drain, and epitaxially regrown source regions.
Figure 9B:
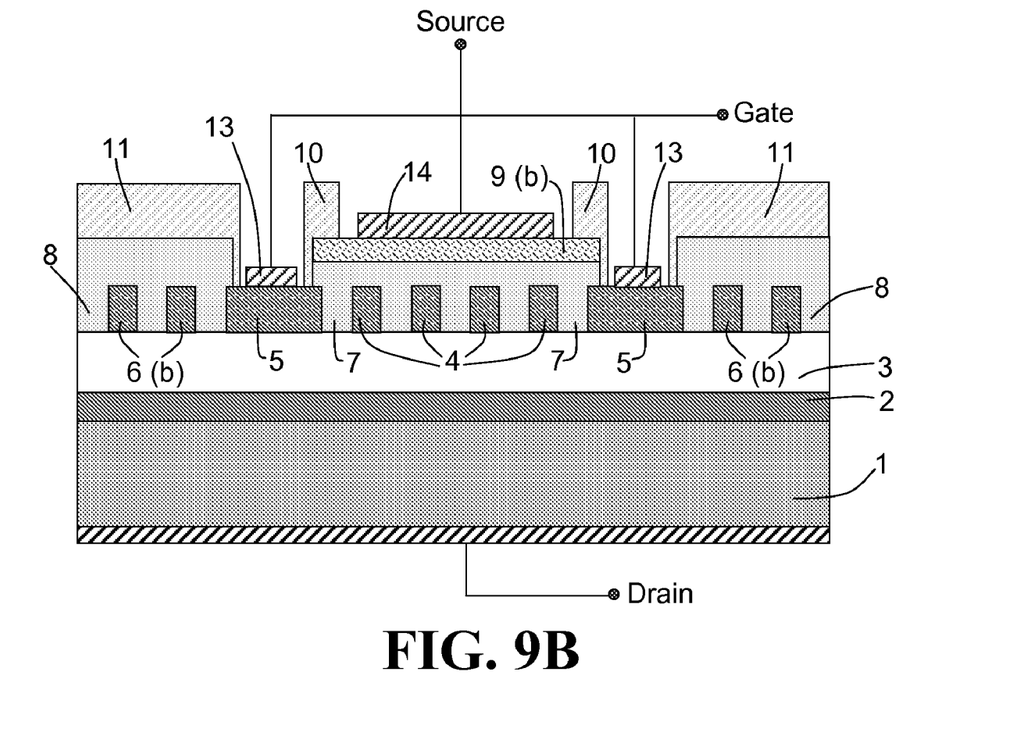
FIG. 9B is a schematic diagram of the metals being deposited to form electrically conducting contacts to gate, drain, and selectively implanted source regions.

A metal layer/stack can then be deposited on top of the source mesa and gate pad regions as well as on the backside of the wafer, followed by a high-temperature anneal to form ohmic contacts to the source, gate, and drain regions. The un-reacted metal can then be etched off. A conducting metal layer or stack is finally patterned on the source and gate pad regions and deposited on the wafer backside (i.e., the drain region) for electrical connections. The source region can be either epitaxially regrown on top of the N-type channel region as shown in FIG. 9A or selectively implanted into the N-type channel region as shown in FIG. 9B. The $P^+$ guard ring region can be either exposed to the dielectric layer or stack as shown in FIG. 9A or buried into the N-type channel region as shown in FIG. 9B.

The devices described herein can be fabricated on the same die and can be implemented for both enhancement and depletion modes of operation by choosing proper widths of the vertical channel. In addition, the presented devices can be monolithically fabricated with a rectifying diode on the same die by adding an additional patterning step to open a window for metal contact on the N-type drift layer. In addition, by inverting the electrical polarity of the substrate and the epi-layers, a VJFET with a P channel can be fabricated.

VJFETs fabricated on the same die may have different widths of the vertical channels (i.e., widths of "source fingers") that would result in different threshold voltages. The possibility to define threshold voltage of the device by layout design provides an additional flexibility for the design of monolithic integrated circuits. For example, having multiple threshold voltages on the same chip enables more flexibility and higher integrity for RF designs. Such flexibility is very difficult to achieve, for example, in the case of devices with a lateral channel such as MOSFETs or lateral JFETs.

Figure 10A:
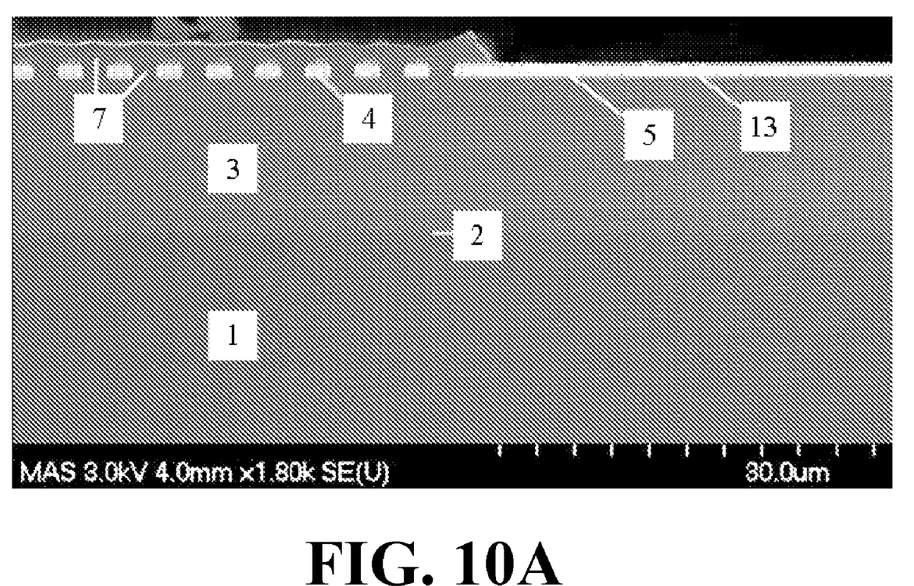
FIG. 10A is a Scanning Electron Micrograph (SEM) of a buried-gate VJFET with self-planarizing epitaxially regrown channel and source regions.
Figure 10B:
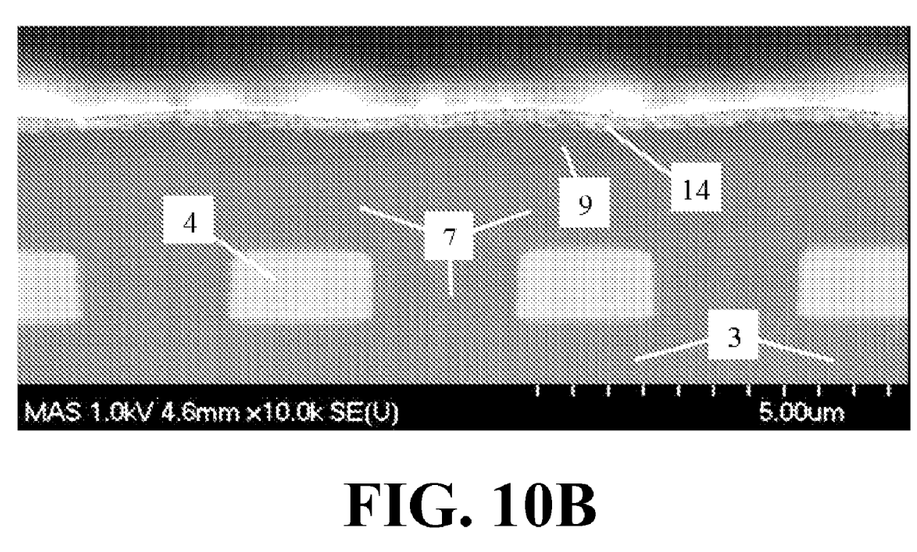
FIG. 10B is a magnified SEM image of a buried-gate VJFET with epitaxially regrown self-planarizing channel and source.

A VJFET with self-planarizing epitaxially regrown channel and source layer is shown in cross-section in FIG. 10A. As shown in FIG. 10A, the regrowth occurs in trenches formed by etching through a P+ epi layer. The resulting P+ gate fingers are clearly visible in FIG. 10A, as is the P+ gate pad with a metal silicide covering. In FIG. 10B, the epitaxially grown n+ source layer 9 can be seen as the darker region separated from the P+ gate fingers 4 by the lightly colored n-channel epitaxial layer 7. The epitaxially grown n+ source layer 9 is also shown to be covered by a metal silicide source contact 14.

Figure 11A:
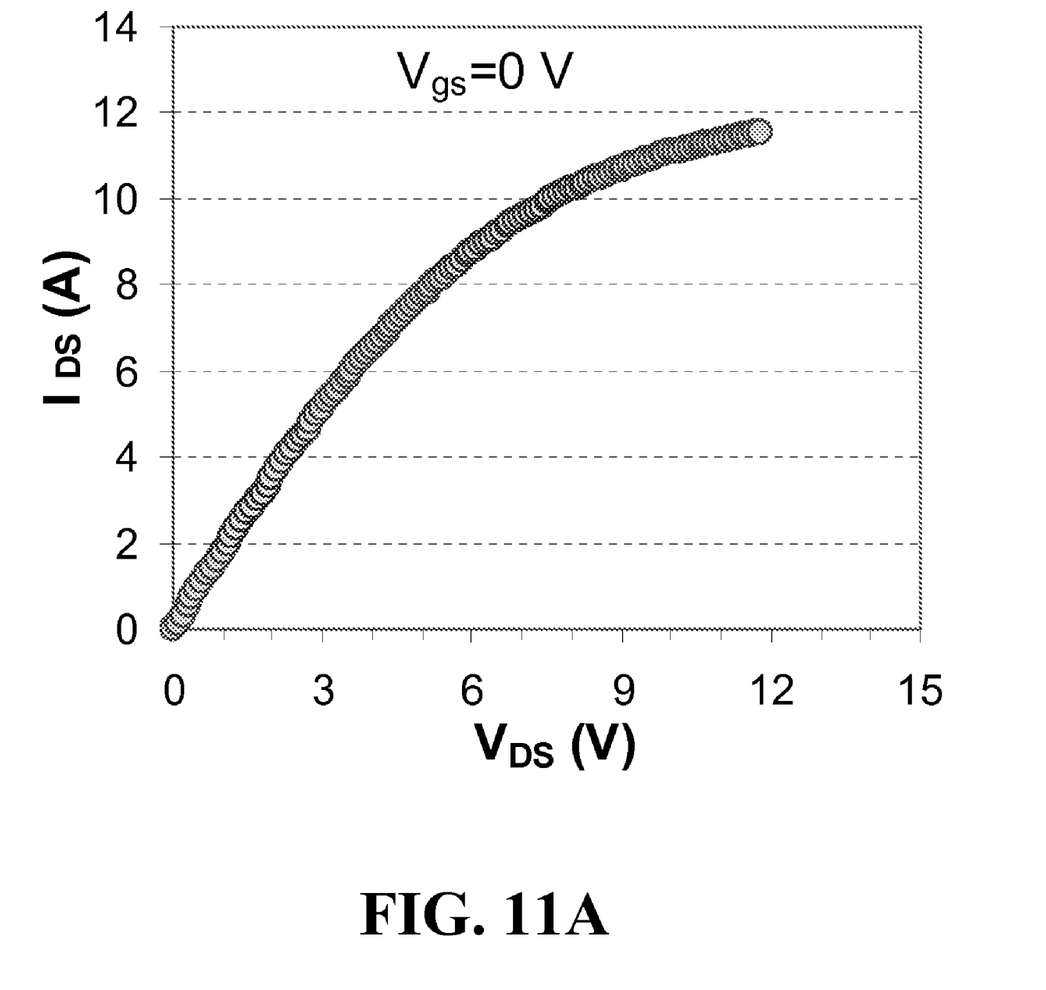
FIG. 11A is a graph showing drain I-V characteristics at zero gate bias for an in-house fabricated VJFET in SiC having homoepitaxially grown drift, buried gate, planarized channel and source regions with 0.5 mm$^2$ active area.
Figure 11B:
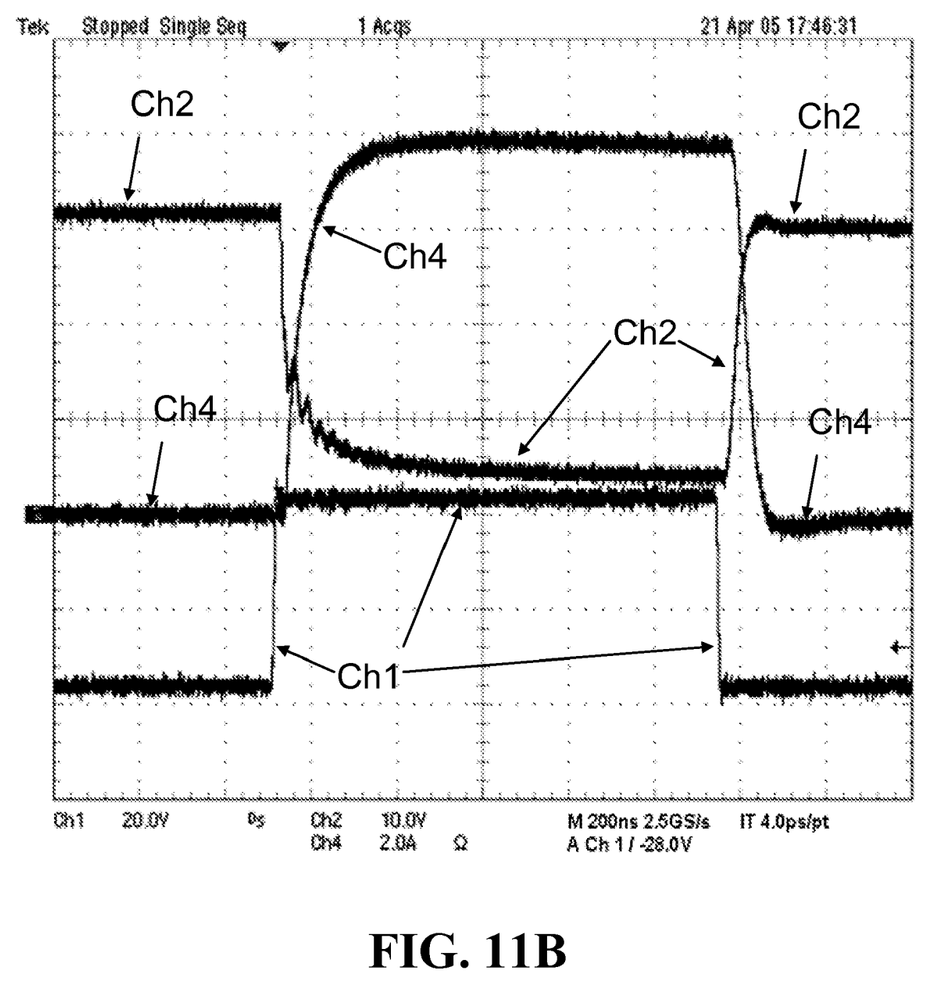
FIG. 11B is a switching waveform measured at room temperature for an in-house fabricated VJFET in SiC having homoepitaxially grown drift, buried gate, planarized channel and source regions with 0.5 mm$^2$ active area.

A VJFET in SiC having homoepitaxially grown drift, buried gate, planarized channel and source regions with 0.5 mm$^2$ active area was fabricated and evaluated. Results of this evaluation are shown in FIG. 11A. As can be seen from FIG. 11A, this device was shown to have very low specific on-resistance (<2.8 mΩ·cm$^2$) at zero gate bias, extremely robust gate-to-source p-n junction, and short total response time (i.e., <230 ns=rise time+fall time+ on- and off-delay time). Drain I-V characteristics measured on discrete vertical channel power VJFETs are shown in FIG. 11A. The switching waveform measured at room temperature is shown in FIG. 11B.

Figure 12:
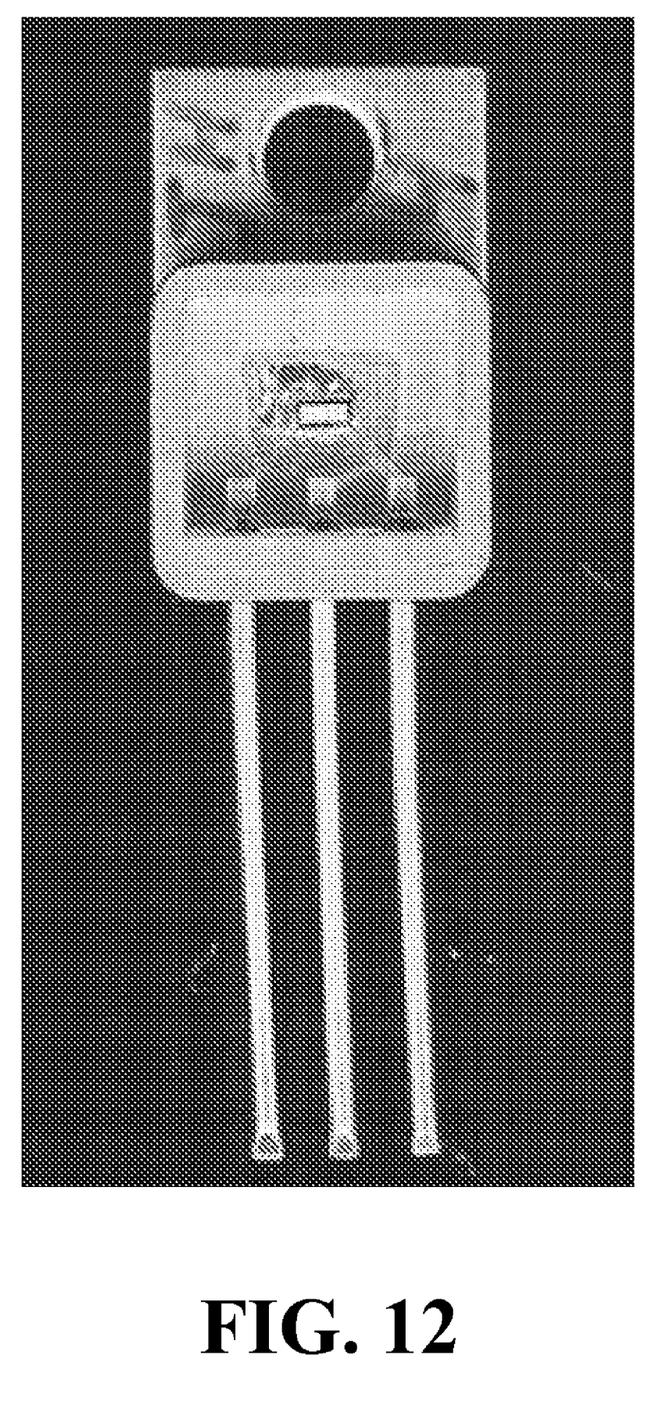
FIG. 12 a photograph of a packaged VJFET in SiC according to one embodiment.

A photograph of a packaged VJFET in SiC is shown in FIG. 12.

Semiconductor devices as described herein can include edge termination structures such as guard rings, junction termination extensions (JTE), or other suitable p-n blocking structures.

The devices described herein can be arranged in parallel to achieve a high current level required by particular applications. The SiC layers of the device can be formed by epitaxial growth on a suitable substrate. The layers can be doped during epitaxial growth.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] K. Shenai, R. S. Scott, and B. J. Baliga, "Optimum Semiconductors for High Power Electronics", IEEE Transactions on Electron Devices, vol. 36, No. 9, pp. 1811-1823, 1989.

[2] J. W. Palmour, "Junction Field-Effect Transistor Formed in Silicon Carbide," U.S. Pat. No. 5,264,713 Nov. 23, 1993.

[3] J. W. Paulmour, M. E. Levinshtein, S. L. Rumyantsev, and G. S. Simin "Low-frequency noise in 4H-silicon carbide junction field effect transistors," Appl. Phys. Lett. Vol. 68, No. 19, 6 May 1996.

[4] Slater, Jr. et al., "Silicon Carbide CMOS devices," U.S. Pat. No. 6,344,663, Fab. 5, 2002.

[5] Baliga, B. J., "Method for making vertical channel field controlled device employing a recessed gate structure," U.S. Pat. No. 4,587,712 May 13, 1986.

[6] P. G. Neudeck et al., "600° C. Logic Gates Using Silicon Carbide JFET's," Government Microcircuit Applications Conference cosponsored by DoD, NASA, DoC, DoE, NSA, and CIA Anaheim, Calif., Mar. 20-24, 2000.

[7] Casady, et al., "Complementary accumulation-mode JFET integrated circuit topology using wide (>2 eV) bandgap semiconductors," U.S. Pat. No. 6,503,782, Jan. 7, 2003.

[8] J. N. Merrett, J. R. Williams, J. D. Cressler, A. Sutton, L. Cheng, V. Bondarenko, I. Sankin, D. Seale, M. S. Mazzola, B. Krishnan, Y. Koshka, and J. B. Casady, "Gamma and Proton Irradiation Effects on 4H-SiC Depletion-Mode Trench JFETs" presented in 5th European Conference on Silicon Carbide and Related Materials (ECSCRM2004), Aug. 31-Sep. 4, 2004, Bologna, Italy.

[9] L. Cheng, I. Sankin, J. N. Merrett, V. Bondarenko, R. Kelley, S. Purohit, Y. Koshka, J. R. B. Casady, J. B. Casady, and M. S. Mazzola, "Cryogenic and High Temperature Performance of 4H-SiC Vertical Junction Field Effect Transistors (VJFETs) for Space Applications," Proceedings of The 17th International Symposium on Power Semiconductor Devices and ICs (ISPSD '05), May 22-26, 2005, Santa Barbara, Calif.

[10] J. N. Merrett, W. A. Draper, J. R. B. Casady, J. B. Casady, I. Sankin, R. Kelley, V. Bondarenko, M. Mazzola, D. Seale, "Silicon Carbide Vertical Junction Field Effect Transistors Operated at Junction Temperatures Exceeding 300° C.," *Proceedings of IMAPS International Conference and Exhibition on High Temperature Electronics (HiTECH 2004)*, May 17-20, 2004, Santa Fe, N. Mex.

[11] Casady, et al., "Self-Aligned Transistor and Diode Topologies in Silicon Carbide Through the Use of Selective Epitaxy or Selective Implantation," U.S. Pat. No. 6,767,783, Jul. 27, 2004.

[12] S. Onda, R. Kumar, and K. Hara, "SiC Integrated MOSFETs," *phys. stat. sol. (a)*, vol. 162, p. 369, 1997.

[13] N. Nordell, and S. Karlsson, "Homoepitaxy of 6H and 4H SiC on nonplanar substrates," Appl. Phys. Lett. Vol. 72, No. 2, pp. 197-199, 12 Jan. 1998.

[14] Y. Chen, T. Kimoto, Y. Takeuchi, R. K. Malhan, and H. Matsunami, "Homoepitaxial Growth of 4H-SiC on Trenched Substrates by Chemical Vapor Deposition," *Mater. Sci. Forum*, Vol. 457-460, pp. 189-192, 2004.

What is claimed is:

1. A method of making a semiconductor device comprising:

selectively etching through a gate layer of semiconductor material of a second conductivity type on a drift layer of semiconductor material of a first conductivity type different than the second conductivity type to expose material of the drift layer, wherein the drift layer is on a semiconductor substrate;

depositing a channel layer of semiconductor material of the first conductivity type on exposed portions of the gate and drift layers to cover the gate layer;

depositing a source layer of semiconductor material of the first conductivity type on the channel layer or, alternatively, implanting a source layer of semiconductor material of the first conductivity type in the channel layer;

selectively etching through the channel layer in a peripheral region of the device where the channel layer is directly in contact with the gate layer to expose a portion of the underlying gate layer, wherein an unexposed portion of the gate layer remains covered by the channel and source layers;

depositing a layer of a dielectric material on exposed surfaces of the source layer, the channel layer and the gate layer;

selectively etching through the dielectric layer over the portion of the gate layer exposed during etching of the channel layer to expose underlying gate layer; and selectively etching through the dielectric layer over the source layer on the unexposed portion of the gate layer to expose underlying source layer.

2. The method of claim 1, further comprising forming contacts on exposed source layer, exposed gate layer and on a surface of the semiconductor substrate opposite the drift layer.

3. The method of claim 1, wherein the dielectric layer over the portion of the gate layer exposed during etching of the channel layer and the dielectric layer over the source layer are etched simultaneously.

4. The method of claim 2, wherein forming contacts comprises depositing an ohmic contact material and subsequently depositing an electrically conductive metal on the ohmic contact material.

5. The method of claim 1, wherein the dielectric layer over the source layer is selectively etched such that dielectric material remains on the periphery of the central region.

6. The method of claim 1, wherein selectively etching through the gate layer forms a plurality of elongate regions of the semiconductor material of the second conductivity type oriented parallel and in spaced relation to one another on the drift layer in the central region of the device.

7. The method of claim 1, wherein selectively etching through the gate layer forms one or more continuous regions of the semiconductor material of the second conductivity type on the drift layer and circumscribing the gate region.

8. The method of claim 6, wherein depositing a channel layer comprises depositing semiconductor material of the first conductivity type between the adjacent elongate regions of semiconductor material of the second conductivity type.

9. The method of claim 7, wherein depositing a channel layer comprises depositing semiconductor material of the first conductivity type on the drift layer adjacent the one or more continuous regions of semiconductor material of the second conductivity type circumscribing the gate region.

10. The method of claim 1, wherein the channel layer is deposited by epitaxial growth on exposed portions of the gate and drift layers.

11. The method of claim 1, wherein the source layer is deposited on the channel layer.

12. The method of claim 1, wherein the source layer is deposited by epitaxial growth on the channel layer.

13. The method of claim 1, wherein the source layer is implanted in the channel layer.

14. The method of claim 1, wherein the drift layer is on a buffer layer comprising a semiconductor material of the first conductivity type and wherein the buffer layer is on the semiconductor substrate.

* * * * *